(12) United States Patent
Orita et al.

(10) Patent No.: US 6,707,836 B2
(45) Date of Patent: Mar. 16, 2004

(54) SEMICONDUCTOR LASER DEVICE

(75) Inventors: Kenji Orita, Takatsuki (JP); Toru Takayama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 60 days.

(21) Appl. No.: 10/028,204

(22) Filed: Dec. 20, 2001

(65) Prior Publication Data

US 2002/0080838 A1 Jun. 27, 2002

(30) Foreign Application Priority Data

Dec. 22, 2000 (JP) .................................... 2000-390087

(51) Int. Cl.[7] .............................................. H01S 5/26
(52) U.S. Cl. .................................... 372/50; 372/46
(58) Field of Search ................................. 372/46, 50

(56) References Cited

U.S. PATENT DOCUMENTS 5,491,711 A * 2/1996 Mand et al. .................. 372/49
6,643,308 B2 * 11/2003 Tsukiji et al. ............... 372/46

OTHER PUBLICATIONS

IEEE Journal Quantum Electronics; vol. 27, No. 6, Jun. 1991, pp. 1609–1615.

* cited by examiner

*Primary Examiner*—James Davie
(74) *Attorney, Agent, or Firm*—Merchant & Gould P.C.

(57) ABSTRACT

A semiconductor laser device of the present invention has a second optical guiding layer provided with a diffraction grating in a portion to be a DBR region and a current blocking layer provided with a stripe-shaped window as a current application portion. A region including this stripe-shaped window serves as a waveguide channel region. Also, in the semiconductor laser device of the present invention, the waveguide channel region in the DBR region is not provided with a contact layer or a p-electrode, and a region other than the waveguide channel region in the DBR region is provided with the contact layer and the p-electrode. By applying current from the p-electrode to the DBR region, the emission wavelength is controlled.

16 Claims, 5 Drawing Sheets

SEMICONDUCTOR LASER DEVICE

BACKGROUND OF THE INVENTION

1. Field of the Invention

The present invention relates to a semiconductor laser device that is used suitably as a light source for optical information processing, optical measurement or the like.

2. Description of Related Art

In recent years, because of their advantage of being compact and inexpensive, semiconductor laser devices have been used widely as a light source for optical information processing, optical measurement and the like.

Among those semiconductor laser devices, Fabry-Pèrot (referred to as "FP" in the following)-type semiconductor laser devices using a FP resonator in which the semiconductor's cleavage planes serve as mirrors are easy to manufacture and thus mass-produced as a light source for a pickup of optical disks. However, they have disadvantages in that their emission wavelength changes depending on temperature and that a laser oscillates at a plurality of longitudinal modes during a high-speed modulation.

In order to solve the above problems without compromising the compactness of the devices, a known semiconductor laser device adopted a technique in which a diffraction grating having a sharp wavelength selectivity is provided in the semiconductor resonator so as to perform light feedback. One of the semiconductor laser devices of this type is a distributed Bragg reflector (referred to as "DBR" in the following) type semiconductor laser device. The DBR type semiconductor laser device has a structure in which an active region for amplifying light and a DBR region provided with a diffraction grating are connected optically so that the light feedback is performed by utilizing a Bragg reflection in the DBR region.

The DBR type semiconductor laser device has the following advantages: (i) by applying electric current to the DBR region, a Bragg wavelength serving as the emission wavelength can be changed easily; (ii) since the active region and the DBR region are provided independently, the degree of design/production flexibility is high.

The following is a description of a conventional DBR type semiconductor laser device as a typical example. The structure of this DBR type semiconductor laser device described here is disclosed in IEEE JOURNAL OF QUANTUM ELECTRONICS VOL. 27, p. 1609.

Figure 5:
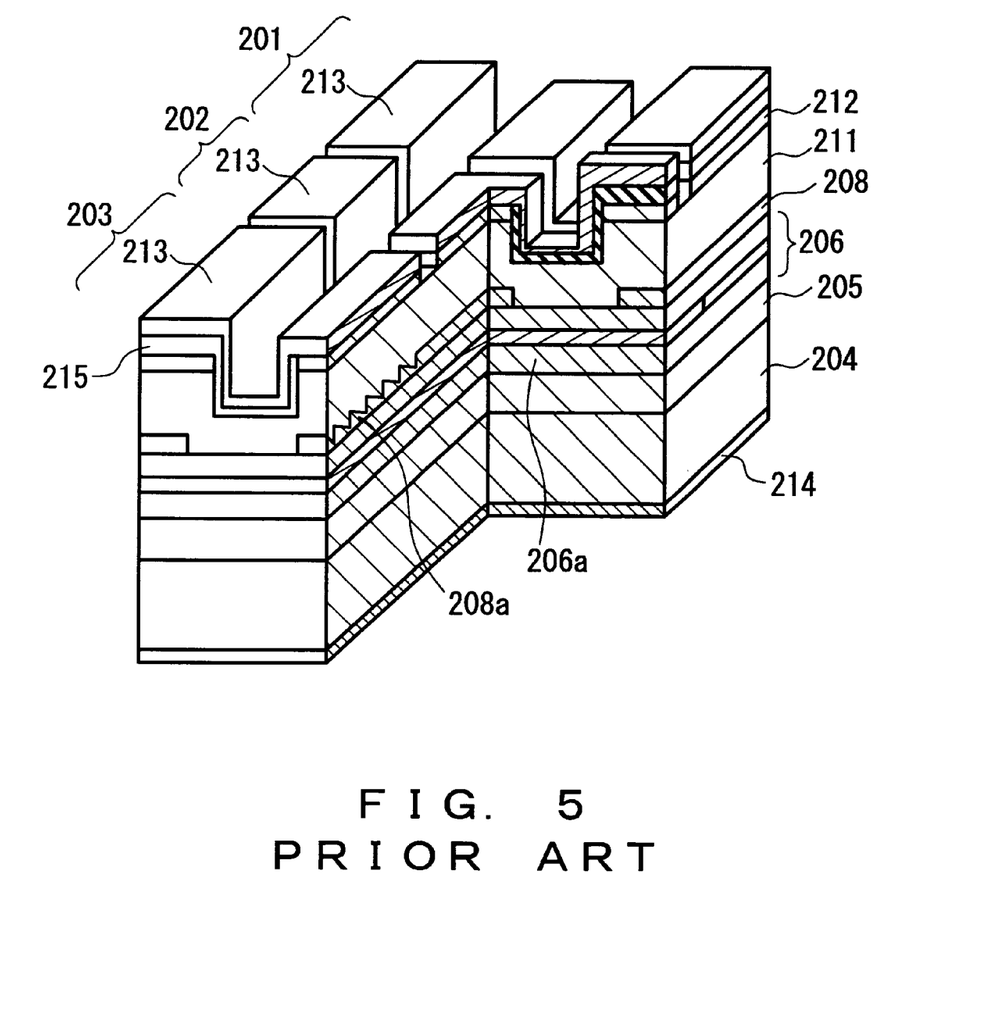
FIG. 5 is a partially sectional perspective view showing a conventional DBR type semiconductor laser device.

FIG. 5 is a partially sectional perspective view showing a DBR type semiconductor laser device with a conventional structure. The DBR type semiconductor laser device is divided into three regions along its optical resonance direction. Numeral 201 denotes an active region, numeral 202 denotes a phase control region, and numeral 203 denotes a DBR region. Next, its layered structure will be described. On an n-type GaAs substrate (n-type substrate) 204, an n-type $Al_{0.6}Ga_{0.4}As$ first cladding layer 205 and an active layer 206 are formed. The active layer 206 includes an undoped GaAs single quantum well and undoped $Al_xGa_{1-x}As$ (x=0.3 to 0.6) distributed refractive index (GRIN) layers that are arranged so as to sandwich the GaAs single quantum well from both external sides. An active layer 206a in the phase control region 202 and the DBR region 203 is disordered by Si ion implantation, thus providing a low-loss treatment for Bragg wavelength light. A rib-shaped n-type $Al_{0.3}Ga_{0.7}As$ optical guiding layer 208 is formed on the active layer 206. The optical guiding layer 208 in the DBR region 203 is provided with a diffraction grating 208a. On the optical guiding layer 208, an n-type $Al_{0.3}Ga_{0.7}As$ second cladding layer 211 and a p-type GaAs contact layer 212 are formed.

The contact layer 212 is arranged separately in the active region 201, the phase control region 202 and the DBR region 203 so that current can be applied independently to each region, and a p-electrode 213 further is provided thereon. The p-electrode 213 is formed immediately above the contact layer 212 in a rib region. In order to narrow the current applied from the p-electrode 213 to the rib region, an insulating layer 215 is provided immediately below the p-electrode 213 in a region other than the rib region. An n-electrode 214 is provided below the n-type substrate 204.

The following is a description of an operation of the conventional DBR type semiconductor laser device structured as above.

First, the current applied from the p-electrode 213 of the active region 201 is narrowed into the rib region by the insulating layer 215 and reaches the active layer 206, so that the active layer 206 in the rib region emits light. The rib region serves as a waveguide channel so as to propagate the emitted light.

When the semiconductor laser device is used as a light source for optical information processing or optical measurement, a single transverse mode is required. To meet this requirement, it is necessary to confine the guided light in the transverse direction effectively. In this DBR type semiconductor laser device with the conventional structure, since the rib-shaped optical guiding layer 208 is provided in the waveguide channel region, the effective refractive index in the waveguide channel region is lower than that in its outer regions, so that the guided light is confined in the transverse direction.

The waveguide structure of the semiconductor laser device that has been described here is a rib waveguide type. However, the operation is essentially the same in other refractive index waveguide structures, for example, a ridge waveguide type.

In this DBR type semiconductor laser device, an end face near the active region 201 and a DBR formed of the diffraction grating 208a in the DBR region 203 serve as two reflecting mirrors so as to form a resonator, so that the guided light is amplified in the active region 201 and emitted as a laser beam.

A plurality of longitudinal modes that satisfy a phase condition of the laser oscillation are present in the DBR type semiconductor laser device like in the FP type semiconductor laser device. Among these longitudinal modes, only the longitudinal mode having a wavelength closest to a Bragg wavelength of the DBR is Bragg-reflected mainly and satisfies an amplitude condition of the laser oscillation. Thus, the single longitudinal mode can be achieved. In this case, the Bragg wavelength $\lambda_b$ is determined by an equation below.

$$\lambda_b = 2N_{eq}\Lambda/q \qquad (1)$$

where $N_{eq}$ represents an equivalent refractive index of the DBR region 203, $\Lambda$ represents a period of the diffraction grating, and q represents an order of the Bragg reflection. For instance, the Bragg wavelength is 850 nm in the DBR type semiconductor laser device of this conventional example.

The emission wavelength is controlled by current applied to the DBR region 203. When the current is applied, this changes the refractive index, that is, $N_{eq}$ in the DBR region. Therefore, the Bragg wavelength can be controlled according to Equation (1).

In this case, however, the emission wavelength only can change discontinuously at an interval of the longitudinal mode. This is because, among the longitudinal modes satisfying the phase condition as above, the one having a wavelength closest to the Bragg wavelength oscillates. In order to allow the emission wavelength to change continuously, it is necessary to control the phase of the guided light, thereby changing the wavelength of the longitudinal mode. For this purpose, the phase control region 202 for changing the phase of the guided light is provided inside the resonator. By applying current to the phase control region 202 so as to change the equivalent refractive index in this region, the phase of the guided light is controlled.

Thus, by setting the current applied to the phase control region 202 and the DBR region 203 appropriately, it is possible to allow the emission wavelength to change continuously.

The change in a refractive index N of a semiconductor by current application mainly is attributable to a plasma effect and a heat effect.

The plasma effect is caused by an applied carrier. The refractive index change $\Delta N_p$ due to the applied carrier $\Delta n_e$ is expressed by the following equation.

$$\Delta N_p = -e^2 N n_e \Delta n_e / (2m^* \epsilon \omega^2) \quad (2)$$

In Equation (2), e represents a unit charge, $n_e$ represents the number of carriers, $m^*$ represents an effective mass of electrons, $\epsilon$ represents a dielectric constant, and $\omega$ represents an angular frequency of the light.

On the other hand, the heat effect is caused by power consumption during the current application. The refractive index change $\Delta N_T$ induced by current I is expressed by the following equations.

$$\Delta N_T = +(\partial N/\partial T) Z_T P_D \quad (3)$$

$$P_D = I V_f + I^2 R_s \quad (4)$$

In Equations (3) and (4), T represents temperature, $Z_T$ represents heat resistance, $P_D$ represents power consumption, $V_f$ represents forward voltage of p-n junction, and $R_s$ represents series resistance. They are all values in the region where current is applied.

In a long-wavelength DBR type semiconductor laser device whose emission wavelength is in a 1.5 $\mu$m band, for example, since the angular frequency $\omega$ of the emission wavelength is small, the refractive index changes mainly by the plasma effect.

On the other hand, in a DBR type semiconductor laser device whose emission wavelength is shorter than 900 nm such as the above-described conventional DBR type semiconductor laser device whose emission wavelength is in a 850 nm band, since the angular frequency $\omega$ is large, the plasma effect is small. Therefore, the refractive index changes mainly by the heat effect.

As described above, the DBR type semiconductor laser device whose emission wavelength is shorter than 900 nm can achieve the control of the emission wavelength by the heat effect of the applied current. Thus, in order to expand a tunable range of the emission wavelength, it is appropriate to raise the efficiency of heat generation by the applied current. However, the conventional DBR type semiconductor laser device needs to have a structure with excellent heat-radiating characteristics to avoid heat saturation and improve reliability. Accordingly, the conventional semiconductor laser device has had a problem that the efficiency of heat generation by the applied current is low, resulting in a limited tunable range of the emission wavelength.

SUMMARY OF THE INVENTION

It is an object of the present invention to provide a semiconductor laser device that can achieve both a high reliability and a wide tunable range of an emission wavelength even when the emission wavelength is shorter than 900 nm.

In order to achieve the above-mentioned object, a semiconductor laser device according to the present invention includes a first semiconductor layer having a diffraction grating in a region to be a Bragg reflection region, a current blocking layer that is provided above the first semiconductor layer and has a current application portion, a second semiconductor layer provided above the current blocking layer, and an electrode provided above the second semiconductor layer. The electrode is arranged at a region other than a region opposing the current application portion in the Bragg reflection region.

Preferably, the semiconductor laser device of the present invention further includes a contact layer above the second semiconductor layer and below the electrode. It is preferable that the contact layer is arranged at a region other than the region opposing the current application portion in the Bragg reflection region or that the contact layer has a portion that is arranged at the region opposing the current application portion, the portion being thinner than other portions in the Bragg reflection region.

Furthermore, the semiconductor laser device of the present invention also can have a structure in which a region including the region opposing the current application portion in the Bragg reflection region is provided with an insulating layer.

This structure elongates the path through which current applied to the Bragg reflection region passes, so that the series resistance in the distributed Bragg reflection region increases. Alternatively, the semiconductor laser device of the present invention may have a structure in which a waveguide channel region in the Bragg reflection region is provided with no electrode, and further is without a contact layer, or has a thin contact layer or an insulating layer. This lowers the heat-radiating characteristics with respect to heat generated in the waveguide channel region in the Bragg reflection region. As a result, the temperature increase owing to heat generation caused by the current applied to the Bragg reflection region becomes larger, thus achieving a wider tunable range of the emission wavelength. On the other hand, an active region associated with reliability has a structure with excellent heat-radiating characteristics as in the conventional semiconductor laser device. Consequently, both the high reliability and the wide tunable range of the emission wavelength can be achieved.

Moreover, the semiconductor laser device of the present invention preferably is provided with a phase control region, which has a similar structure to the Bragg reflection region of the semiconductor laser device of the present invention.

With this structure, the efficiency of heat generation by applied current improves also in the phase control region, so that the phase controllability can be raised. This reduces the applied current that is needed for allowing the wavelength to change continuously.

Other objects, characteristics and advantages of the present invention will be understood fully by the following description. The benefit of the present invention also will become apparent from the following description with reference to the accompanying drawings.

DESCRIPTION OF THE PREFERRED EMBODIMENTS

The following is a description of embodiments of the present invention, with reference to the accompanying drawings.

First Embodiment

Figure 1A:
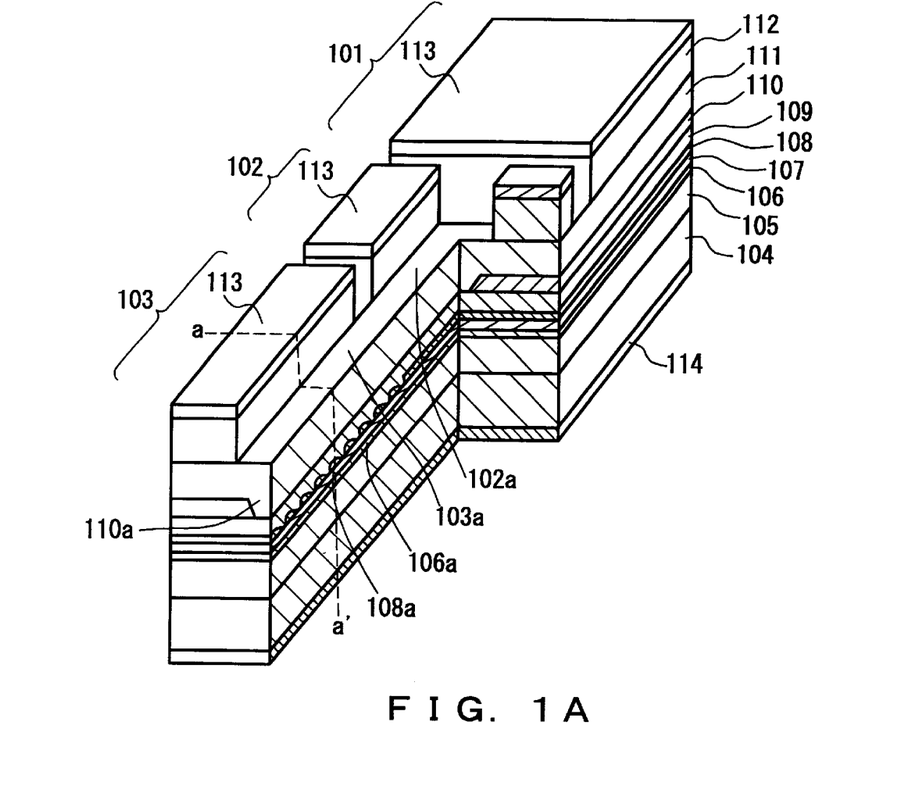
FIG. 1A is a partially sectional perspective view showing a DBR type semiconductor laser device in a first embodiment of the present invention.
Figure 1B:
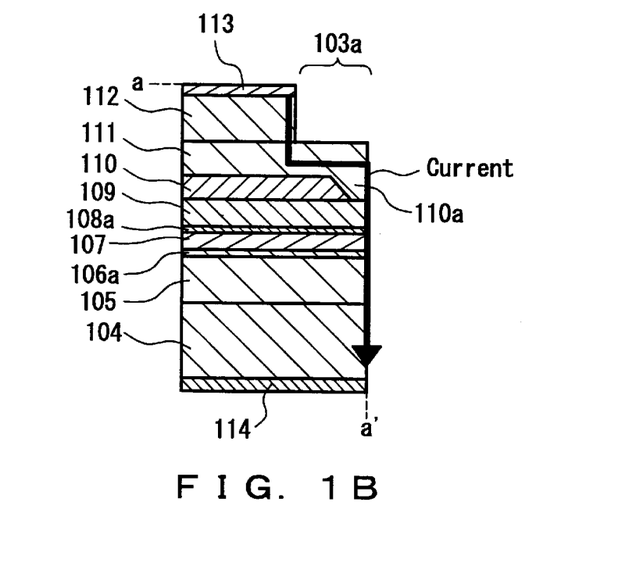
FIG. 1B is a sectional view taken along the line a–a' in FIG. 1A.

FIGS. 1A and 1B show a semiconductor laser device in the first embodiment of the present invention. FIG. 1A is a partially sectional perspective view showing the semiconductor laser device of the present embodiment, which is a DBR type semiconductor laser device divided along its optical resonance direction into three regions of an active region 101, a phase control region 102 and a DBR region 103. The active region 101, the phase control region 102 and the DBR region 103 respectively may have a length in the resonance direction of 500 $\mu$m, 300 $\mu$m and 500 $\mu$m, for example.

Next, its layered structure will be described. On an n-type GaAs substrate 104, an n-type $Al_{0.5}Ga_{0.5}As$ first cladding layer 105 and an active layer 106, having a quantum well structure in which the GaAs layer serves as a well layer, are formed. An active layer 106a in the phase control region 102 and the DBR region 103 is disordered by a Zn distribution, thus providing a low-loss treatment for light with an emission wavelength. A p-type $Al_{0.5}Ga_{0.5}As$ first optical guiding layer 107 and a p-type $Al_{0.2}Ga_{0.8}As$ second optical guiding layer (which may be an example of a first semiconductor layer in the claims) 108 are formed on the active layer 106. The second optical guiding layer 108 in the DBR region 103 is provided with a diffraction grating 108a. On the second optical guiding layer 108, a p-type $Al_{0.5}Ga_{0.5}As$ third optical guiding layer 109 is formed.

On the third optical guiding layer 109, an n-type $Al_{0.6}Ga_{0.4}As$ current blocking layer 110 is formed for narrowing current. The current blocking layer 110 is provided with a stripe-shaped window 110a to be a current path, in other words, an opening to be a current application portion. In the present embodiment, the stripe-shaped window 110a has a width of 2.5 $\mu$m. Furthermore, a p-type $A_{0.5}Ga_{0.5}As$ second cladding layer (which may be an example of a second semiconductor layer in the claims) 111 is formed on the current blocking layer 110 including the stripe-shaped window 110a.

Since the region including the stripe-shaped window 110a serves as a waveguide channel according to this structure, the waveguide channel is formed in a self-aligned manner.

On the second cladding layer 111, a contact layer 112 is divided into three and provided on each of the active region 101, the phase control region 102 and the DBR region 103. The contact layer 112 is absent from a waveguide channel region 102a in the phase control region 102 and a waveguide channel region 103a in the DBR region 103. In the present embodiment, the waveguide channel region 102a in the phase control region 102 and the waveguide channel region 103a in the DBR region 103 both may have a width of 20 $\mu$m.

A p-electrode 113 is provided on each of the three separate contact layers 112. In addition, an n-electrode 114 is provided below the n-type GaAs substrate 104.

For the purpose of achieving a high output power, a front end face from which a laser beam is emitted, namely, a cleavage plane near the active region 101, is provided with a low-reflection coating having a reflectivity of 5%. Also, in order to prevent reflection on a rear end face, which is not a Bragg reflection in the DBR region 103, and realize a single longitudinal mode, a cleavage plane near the DBR region 103 is provided with an anti-reflection coating having a reflectivity of 1% or lower.

A chip of the semiconductor laser device structured as above may be mounted junction down, in other words, the p-side of the chip and a heat sink are soldered to each other, so as to provide the active region 101 with excellent heat-radiating characteristics.

The following is a description of an operation of the semiconductor laser device of the present embodiment structured as above.

First, the current blocking layer 110 allows the current applied from the p-electrode 113 of the active region 101 to reach the active layer 106 located below via the stripe-shaped window 110a. This current causes the active layer 106 below the stripe-shaped window 110a to emit light. The emitted light propagates through the waveguide channel regions 102a and 103a. The current blocking layer 110 serves not only to narrow the applied current but also to confine the guided light in the transverse direction.

Conventionally, GaAs sometimes has been used for the current blocking layer 110. In such cases, the guided light is confined in the waveguide channel by being absorbed in the current blocking layer 110, namely, by the difference between real parts of effective refractive indexes in the waveguide channel and its both sides and that between imaginary parts thereof. However, this light absorption makes it difficult to reduce an operating current. Also, in the structure in which the light is confined in the waveguide channel by absorption, since the current blocking layer 110 is limited to GaAs, the degree of design flexibility is low and a transverse mode is hard to stabilize during a high output power. In the present embodiment, on the other hand, the refractive index of the second cladding layer 111 is designed to be higher than that of the current blocking layer 110 based on the difference in Al composition. Accordingly, the guided light is confined in the waveguide channel by the difference between the real parts of the effective refractive indexes in the waveguide channel regions 102a and 103a and their both sides. Moreover, the current blocking layer 110 does not absorb the guided light because it has a larger band gap than the active layer 106. Thus, the semiconductor laser device of the present embodiment can achieve a reduced operating current compared with the case of using GaAs for the current blocking layer 110.

The refractive index of the second cladding layer 111 that is formed in the stripe-shaped window 110a decreases by the plasma effect caused by the current application. In particular, when applying a large current to obtain a high output power, such a decrease in the refractive index brings about an anti-waveguide mode, making it impossible to obtain a single transverse mode. Accordingly, in the structure of the present embodiment, the refractive index of the second cladding layer 111 is designed to be higher than that of the current blocking layer 110 based on the difference in Al composition. This structure makes it possible to prevent the generation of the anti-waveguide mode even during a high output power of 200 mW or more, thereby providing the single transverse mode in a stable manner.

In the semiconductor laser device of the present embodiment, an end face near the active region 101 and a DBR of the diffraction grating 108a in the DBR region 103 serve as two reflecting mirrors so as to form a resonator, so that the guided light is amplified in the active region 101 and emitted as a laser beam. There are a plurality of longitudinal modes that satisfy a phase condition of the laser oscillation. Among these longitudinal modes, the one having a wavelength close to a Bragg wavelength of the DBR is Bragg-reflected mainly and satisfies the laser oscillation condition. In the present embodiment, the Bragg wavelength, namely, the emission wavelength, is 850 nm.

The emission wavelength is controlled by applying current from the p-electrode 113 to the DBR region 103. As described above, the waveguide channel region 103a in the DBR region 103 is not provided with the contact layer 112 or the p-electrode 113. Therefore, the current applied from the p-electrode 113 to the DBR region 103 advances about 10 μm in the transverse direction in the p-side semiconductor layer (the second cladding layer 111), passes through the stripe-shaped window 110a to be the current path and then flows in a thickness direction of the chip (downward) into the n-electrode 114, as shown in FIG. 1B, which is a sectional view of the DBR region 103. When the current flows like this, heat is generated due to series resistance of the current path. In the conventional structure shown in FIG. 5, since the contact layer 212 and the p-electrode 213 are provided also in the waveguide channel region (the rib-region) in the phase control region 202 and the DBR region 203, the current path extends from the p-electrode 213 along the thickness direction of the chip via the contact layer 212 to the n-electrode 214. On the other hand, because the semiconductor laser device of the present embodiment has the above-described structure, the current path thereof is longer in the large resistance region than that in the conventional structure, resulting in an increase in the series resistance. This increases the heat generated by the current application compared with the conventional structure. Furthermore, the heat generated in the waveguide channel region is radiated easily via the contact layer 212 and the p-electrode 213 in the conventional structure, while the structure of the present embodiment has lower heat-radiating characteristics than the conventional structure because the contact layer 112 and the p-electrode 113 are not provided in the waveguide channel region. Consequently, the efficiency of heat generation by the current application rises, thus expanding the tunable range of the emission wavelength.

Although the emission wavelength is controlled to be 850 nm in the present embodiment, it also can be changed by changing the refractive index of the DBR region 103 by the heat effect caused by the current application.

However, when the current is applied to the DBR region 103, the emission wavelength only can be changed discontinuously at an interval of the longitudinal mode. Thus, in order to allow the emission wavelength to change continuously, the current is applied not only to the DBR region 103 but also to the phase control region 102. As described above, the waveguide channel region 102a in the phase control region 102 is not provided with the contact layer 112 or the p-electrode 113 in the semiconductor laser device of the present embodiment. Therefore, as in the case of the DBR region 103, the current applied from the p-electrode 113 to the phase control region 102 advances about 10 μm in the transverse direction in the p-side semiconductor layer and then passes through the stripe-shaped window 110a to be the current path. Thus, as in the DBR region 103, the efficiency of heat generation by the applied current rises also in the phase control region 102, thus allowing the emission wavelength to change continuously.

As described above, according to the present embodiment, since the current applied to the DBR region 103 advances about 10 μm in the transverse direction in the p-side semiconductor layer (the second cladding layer 111), it is possible to raise the series resistance of the DBR region 103. Also, since the region 103a including the waveguide channel in the DBR region 103 is not provided with the contact layer 112 or the p-electrode 113, the heat-radiating characteristics in the DBR region 103 can be lowered even when the chip is mounted junction down. As a result, the efficiency of heat generation by the applied current rises in the DBR region 103, thus expanding the tunable range of the emission wavelength.

Figure 2:
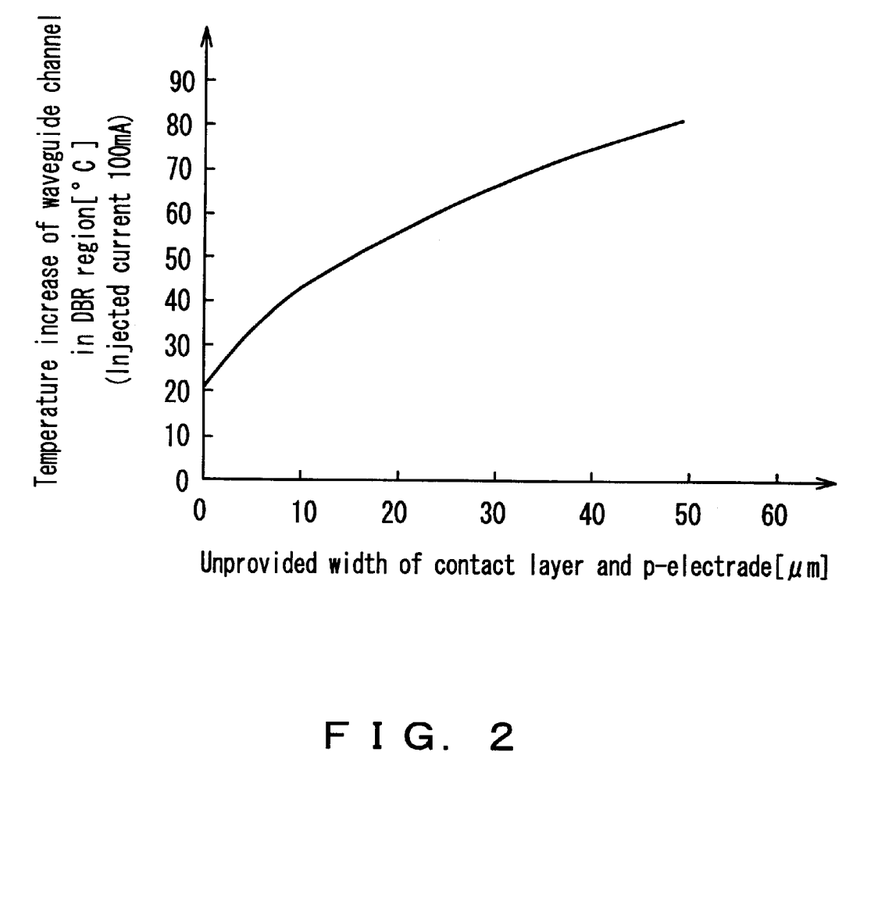
FIG. 2 is a graph showing the relationship between a width over which a contact layer and a p-electrode are not provided and a temperature increase of a waveguide channel region in a DBR region, in the DBR type semiconductor laser device in the first embodiment of the present invention.

This effect was confirmed by simulation, and the result thereof is indicated in FIG. 2, which shows the relationship between a width over which the contact layer 112 and the p-electrode 113 are not provided (an unprovided width) and a temperature increase of the waveguide channel region 103a in the DBR region 103. The applied current is 100 mA in this case.

According to the result, the temperature increase of the waveguide channel region 103a becomes larger with increasing unprovided width of the contact layer 112 and the p-electrode 113, thus improving the efficiency of heat generation. Thus, by forming the unprovided region of the contact layer 112 and the p-electrode 113 in the waveguide channel region 103a, it becomes possible to expand the tunable range of the emission wavelength by the heat effect.

An actual wavelength tunable range in the case of applying current of 80 mA to the DBR region 103 was 2 nm for the conventional semiconductor laser device, whereas it was 4 nm for the semiconductor laser device of the present embodiment.

Furthermore, according to the present embodiment, since the phase control region 102 has the same structure as the DBR region 103, the efficiency of heat generation by the applied current therein improves, thus raising a phase controllability. Accordingly, less current to the phase control region 102 is needed for tuning the wavelength continuously. When current of 0 to 100 mA was applied to the DBR region 103, an actual current applied to the phase control region 102 that was needed for tuning the wavelength continuously was 0 to 160 mA for the conventional structure 10 whereas it was reduced down to 0 to 80 mA for the semiconductor laser device of the present embodiment.

Moreover, according to the present embodiment, since the p-electrode 113 from which the current can be applied may be formed on an entire surface of the active region 101, which thus has excellent heat-radiating characteristics, it is possible to prevent the heat saturation at room temperature and achieve an output power of 200 mW or more. The device of the present embodiment also has a high reliablity. In a life test at an output power of 100 mW at room temperature, the change amount of the operating current value was suppressed within several percent even after 10,000 hours, and the device did not deteriorate.

In the semiconductor laser device of the present embodiment, the waveguide channel region 102a in the phase control region 102 and the waveguide channel region 103a in the DBR region 103 are not provided with the contact layer 112. However, they may be provided with a contact layer 112, which is made to be thinner than the contact layer 112 provided in a region without the waveguide channel. In this case, since a longer current path also increases the resistance as described above, the heat generated by the current applied to the phase control region 102 and the DBR region 103 increases, thus expanding the tunable range of the emission wavelength.

Second Embodiment

Figure 3A:
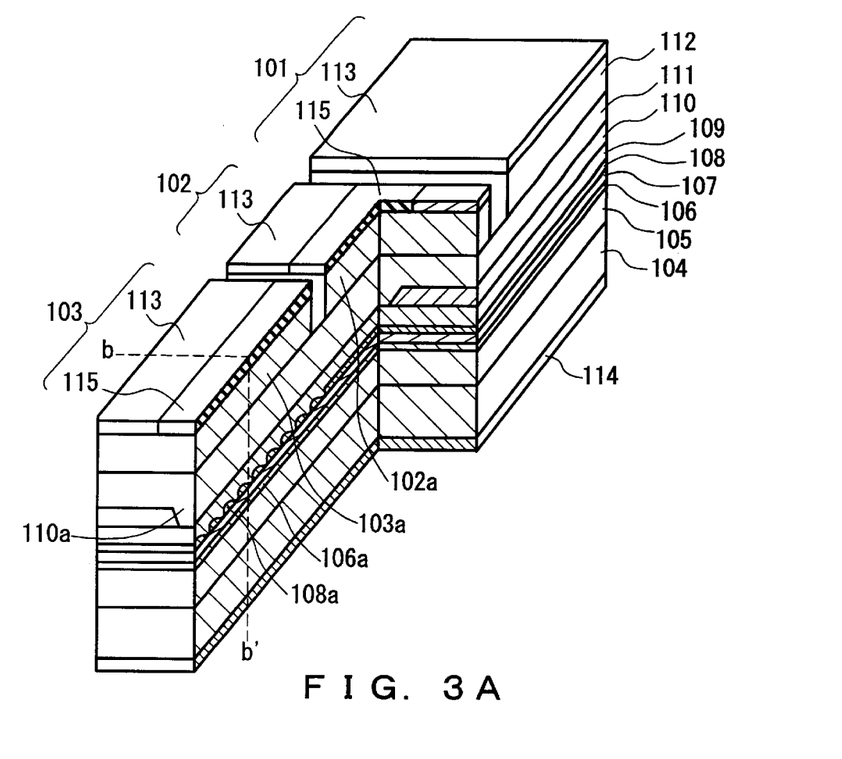
FIG. 3A is a partially sectional perspective view showing a DBR type semiconductor laser device in a second embodiment of the present invention.
Figure 3B:
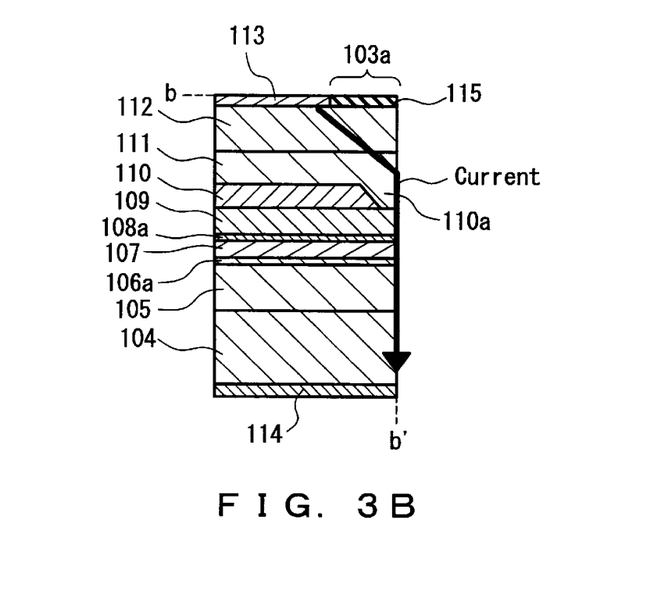
FIG. 3B is a sectional view taken along the line b–b' in FIG. 3A.

FIGS. 3A and 3B show a semiconductor laser device in a second embodiment of the present invention. FIG. 3A is a partially sectional perspective view showing the semiconductor laser device of the present embodiment, whose basic structure is substantially the same as that of the first embodiment. The emission wavelength of this semiconductor laser device is 850 nm.

In the semiconductor laser device of the first embodiment, the waveguide channel region 102a in the phase control region 102 and the waveguide channel region 103a in the DBR region 103 are not provided with the contact layer 112. On the other hand, in the semiconductor laser device of the present embodiment, the waveguide channel region 102a in the phase control region 102 and the waveguide channel region 103a in the DBR region 103 are provided with the contact layer 112 similar to that in the active region 101. The contact layer 112 is arranged immediately above the second cladding layer 111. Furthermore, in the device of the present embodiment, an insulating layer 115 is formed immediately above the contact layer 112 in the waveguide channel regions 102a and 103a. In the present embodiment, the waveguide channel regions 102a and 103a both may have a width of 50 µm.

Although a silicon oxide layer having a thickness of 0.3 µm is used as the insulating layer 115 in the present embodiment, other insulating oxides such as aluminum oxide, zinc oxide and titanium oxide can be used as well.

The p-type electrode 113 for applying current to the phase control region 102 and the DBR region 103 is formed immediately above the contact layer 112 in a region other than the waveguide channel region 102a in the phase control region 102 and the waveguide channel region 103a in the DBR region 103.

In the semiconductor laser device of the present embodiment with the above-described structure, as in the first embodiment, when current is applied to the phase control region 102 and the DBR region 103, the current advances about 10 µm in the transverse direction in the p-side semiconductor layer (the second cladding layer 111 and the contact layer 112) and then passes through the stripe-shaped window 110a to be the current path as illustrated in FIG. 3B. This raises the series resistance of the phase control region 102 and the DBR region 103 as in the first embodiment. Also, since the waveguide channel region 102a in the phase control region 102 and the waveguide channel region 103a in the DBR region 103 are not provided with the p-electrode 113 but provided with the insulating layer 115, the heat-radiating characteristics in the phase control region 102 and the DBR region 103 can be lowered even when the chip is mounted junction down.

Figure 4:
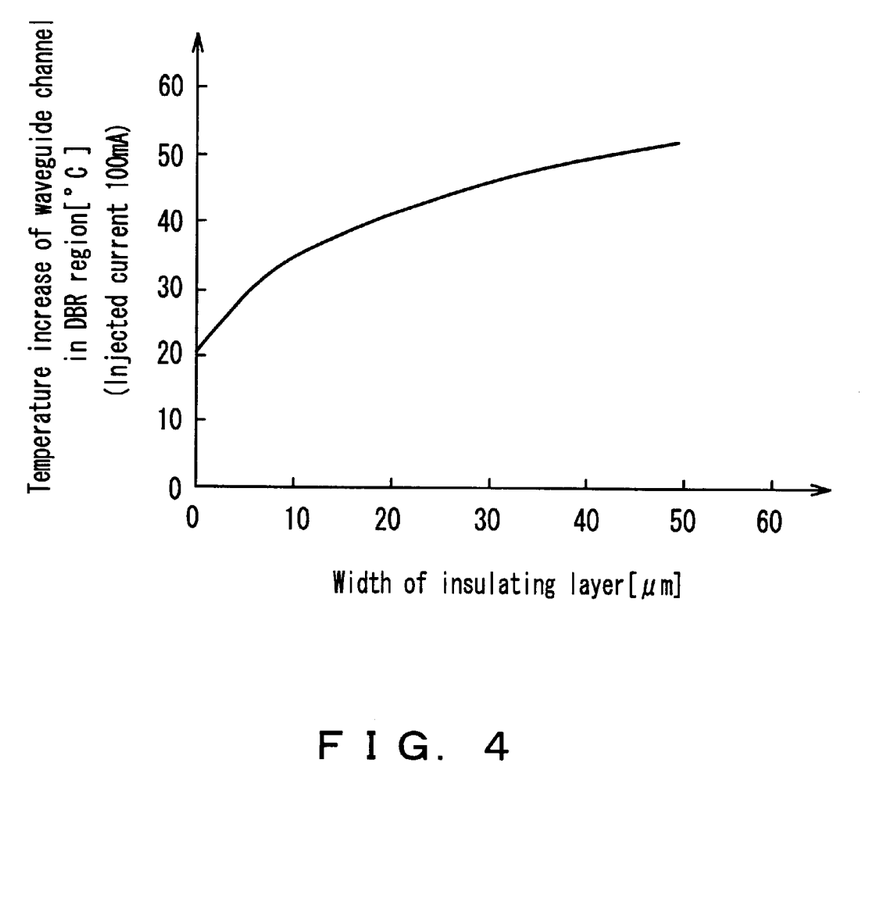
FIG. 4 is a graph showing the relationship between a width of an insulating layer and a temperature increase of a waveguide channel region in a DBR region, in the DBR type semiconductor laser device in the second embodiment of the present invention.

The effect in the DBR region 103 was confirmed by simulation as in the first embodiment, and the result thereof is indicated in FIG. 4, which shows the relationship between a width of the insulating layer 115 and a temperature increase of the waveguide channel region 103a in the DBR region. The applied current is 100 mA in this case.

According to this result, the temperature increase of the waveguide channel region 103a becomes larger with increasing width of the insulating layer 115, thus improving the efficiency of heat generation. Thus, the heat generation amount by the current in the phase control region 102 and the DBR region 103 increases, making it possible to both expand the tunable range of the emission wavelength and achieve high reliability as in the first embodiment.

Furthermore, by providing the insulating layer 115 as described above, a solder material is diffused into the semiconductor layer via the second cladding layer 111 of the waveguide channel region 102a in the phase control region 102 and the waveguide channel region 103a in the DBR region 103, thereby preventing the deterioration of the semiconductor laser device.

Moreover, unlike the above-described first embodiment, the waveguide channel region 102a in the phase control region and the waveguide channel region 103a in the DBR region are provided with the contact layer 112 similar to that in the active region 101 in the present embodiment. Therefore, the light distribution within a plane perpendicular to the optical resonance direction of the guided light in the phase control region 102 and the DBR region 103 is substantially the same as that in the active region 101. Consequently, the coupling coefficient of optical waveguide between the active region 101, the phase control region 102 and the DBR region 103 can be made substantially 100%, thereby achieving an improved differential quantum efficiency compared with the first embodiment. Accordingly, the slope efficiency of current-optical output characteristics improves, thus reducing the operating current. An actual operating current at an optical output of 100 mW was 150 mA in the first embodiment described above, whereas it was reduced down to 120 mA in the second embodiment.

Although the phase control region 102 is provided in the first and second embodiments of the present invention, it does not have to be provided if the wavelength need not be tuned continuously.

Furthermore, although the first and second embodiments of the present invention have a real refractive index guided self-aligned structure, they may have a real refractive index guided ridge structure.

Moreover, in the first and second embodiments of the present invention, the emission wavelength is set to be 850 nm by using AlGaAs semiconductor material. However, it may be possible to use other materials capable of achieving an emission wavelength of 900 nm or shorter, that is, semiconductor materials such as AlGaInP materials, BAlGaInN materials, ZnMgCdSSe materials, AlGaInNAs materials or AlGaInNP materials.

As described in the first and second embodiments, the semiconductor laser device of the present invention has a structure in which no p-electrode is provided in the waveguide channel region in the DBR region, and no contact layer, a contact layer that is thinner than that in the other portions or an insulating layer immediately above the contact layer is provided in the waveguide channel region in the DBR region. In this case, the series resistance in the current path of the current applied to the waveguide channel region in the DBR region becomes larger than that in the conventional structure. Furthermore, the heat-radiating characteristics are lower compared with the conventional structure. As a result, the heat generation amount by the current applied to the DBR region can be increased, making it possible to expand the tunable range of the emission wavelength by the current applied to the DBR region.

In the case of providing the phase control region, which has the same structure with that of the DBR region, the phase controllability by the current applied to the phase control region improves by the same effect as in the DBR region. This makes it possible to tune the wavelength continuously with a low output power.

The active region, on the other hand, is provided with the contact layer and the electrode so that current can be applied uniformly across a wide range, thus improving the heat-radiating characteristics. Therefore, it is possible to achieve a high reliability.

As described above, the present invention provides a semiconductor laser device whose emission wavelength is shorter than 900 nm, and that can both expand the tunable range of the emission wavelength and achieve high reliability.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor laser device comprising:
    a first semiconductor layer having a diffraction grating in a region acting as a Bragg reflection region;
    a current blocking layer that is provided above the first semiconductor layer and has a current application portion;
    a second semiconductor layer provided above the current blocking layer; and
    an electrode provided above the second semiconductor layer;
    the semiconductor laser device being divided along its optical resonance direction into an active region and the Bragg reflection region;
    wherein the electrode is arranged at a region other than a region opposing the current application portion in the Bragg reflection region.

2. The semiconductor laser device according to claim 1, further comprising a contact layer above the second semiconductor layer and below the electrode;
    wherein the contact layer is arranged at a region other than the region opposing the current application portion in the Bragg reflection region.

3. The semiconductor laser device according to claim 1, further comprising a contact layer above the second semiconductor layer and below the electrode;
    wherein the contact layer has a portion that is arranged at the region opposing the current application portion, the portion being thinner than other portions in the Bragg reflection region.

4. The semiconductor laser device according to claim 1, wherein the semiconductor laser device has a phase control region, and
    the electrode is arranged at a region other than the region opposing the current application portion in the phase control region.

5. The semiconductor laser device according to claim 4, further comprising a contact layer above the second semiconductor layer and below the electrode;
    wherein the contact layer is arranged at a region other than the region opposing the current application portion in the phase control region.

6. The semiconductor laser device according to claim 4, further comprising a contact layer above the second semiconductor layer and below the electrode;
    wherein the contact layer has a portion that is arranged at the region opposing the current application portion, the portion being thinner than other portions in the phase control region.

7. The semiconductor laser device according to claim 1, wherein a region including the region opposing the current application portion in the Bragg reflection region is provided with an insulating layer.

8. The semiconductor laser device according to claim 4, wherein a region including the region opposing the current application portion in the phase control region is provided with an insulating layer.

9. The semiconductor laser device according to claim 7, wherein the insulating layer is provided on a contact layer formed above the second semiconductor layer.

10. The semiconductor laser device according to claim 8, wherein the insulating layer is provided on a contact layer formed above the second semiconductor layer.

11. The semiconductor laser device according to claim 1, wherein the current application portion is a stripe-shaped opening formed in the current blocking layer.

12. The semiconductor laser device according to claim 7, wherein the insulating layer is formed of an oxide.

13. The semiconductor laser device according to claim 8, wherein the insulating layer is formed of an oxide.

14. The semiconductor laser device according to claim 12, wherein the oxide is selected from the group consisting of a silicon oxide, an aluminum oxide, a zinc oxide and a titanium oxide.

15. The semiconductor laser device according to claim 13, wherein the oxide is selected from the group consisting of a silicon oxide, an aluminum oxide, a zinc oxide and a titanium oxide.

16. The semiconductor laser device according to claim 1, wherein the second semiconductor layer has a higher refractive index than the current blocking layer.

* * * * *